(12) United States Patent
Miller et al.

(10) Patent No.: US 6,759,687 B1
(45) Date of Patent: Jul. 6, 2004

(54) ALIGNING AN OPTICAL DEVICE SYSTEM WITH AN OPTICAL LENS SYSTEM

(75) Inventors: David B. Miller, Los Angeles, CA (US); Hing-Wah Chan, San Jose, CA (US); Tanya J. Snyder, Edina, MN (US)

(73) Assignee: Agilent Technologies, Inc., Palo Alto, CA (US)

( * ) Notice: Subject to any disclaimer, the term of this patent is extended or adjusted under 35 U.S.C. 154(b) by 57 days.

(21) Appl. No.: 09/688,064

(22) Filed: Oct. 13, 2000

(51) Int. Cl.[7] ............................................... H01L 33/00
(52) U.S. Cl. .......................... 257/98; 257/99; 257/432; 257/433
(58) Field of Search .............................. 257/81–84, 98, 257/99, 432–434; 385/88–94

(56) References Cited

U.S. PATENT DOCUMENTS

| | | | |
|---|---|---|---|
| 4,457,467 A | 7/1984 | Klement et al. | |
| 5,073,041 A | 12/1991 | Rastani | |
| 5,163,108 A | 11/1992 | Armiento et al. | 385/89 |
| 5,337,397 A * | 8/1994 | Lebby et al. | 385/93 |
| 5,460,320 A | 10/1995 | Belcher et al. | 228/180.22 |
| 5,568,318 A | 10/1996 | Leger et al. | |
| 5,701,008 A | 12/1997 | Ray et al. | |
| 5,774,614 A | 6/1998 | Gilliland et al. | 385/88 |
| 5,923,796 A * | 7/1999 | Feldman et al. | 257/98 |
| 5,981,945 A | 11/1999 | Spaeth et al. | |
| 6,005,262 A | 12/1999 | Cunningham et al. | 257/84 |
| 6,037,641 A * | 3/2000 | Goel | 257/432 |
| 6,051,848 A | 4/2000 | Webb | 257/99 |
| 6,243,508 B1 * | 6/2001 | Jewell et al. | 385/93 |
| 2002/0034363 A1 * | 3/2002 | Wickman et al. | 385/90 |

FOREIGN PATENT DOCUMENTS

| | | |
|---|---|---|
| DE | 19651260 | 1/1998 |
| EP | 0579438 A2 | 7/1993 |
| EP | 0649041 A | 10/1994 |
| JP | 06-340118 | * 12/1994 |
| JP | 11354769 | 7/1998 |
| JP | 11354767 | 12/1999 |

* cited by examiner

Primary Examiner—Minh-Loan Tran (57) ABSTRACT

A scheme (systems and methods) for passively aligning one or more optical devices with a corresponding number of optical lenses in an accurate and efficient manner is described. By this approach, the invention avoids the often labor-intensive and costly steps required by conventional active alignment techniques that attempt to align the optical devices to the optical fibers. In one aspect, an optoelectronic device includes an optical device system, an optical lens system and a plurality of solder bumps disposed therebetween. The optical device system includes an optical device substrate supporting one or more optical devices and a solderable metallization pattern having a spatial arrangement with respect to the one or more optical devices. The optical lens system includes one or more optical lenses and a device bonding surface supporting a solderable metallization pattern having a spatial arrangement with respect to the one or more optical lenses. The solder bumps are disposed between the metallization patterns of the optical device system and the optical lens system. The plurality of solder bumps bond the optical device substrate to the device bonding surface with the one or more optical devices aligned with the one or more optical lenses. In another aspect, the optical lens system includes a spacer substrate defining one or more apertures therethrough. A method of aligning an optical device system and an optical lens system also is described.

21 Claims, 5 Drawing Sheets

ALIGNING AN OPTICAL DEVICE SYSTEM WITH AN OPTICAL LENS SYSTEM

TECHNICAL FIELD

This invention relates to systems and methods for aligning an optical device system with an optical lens system.

BACKGROUND

Many advanced communication systems transmit information through a plurality of parallel optical communication channels. The optical communication channels may be defined by a fiber optic ribbon interconnect (or fiber optic cable) formed from a bundle of glass or plastic fibers, each of which is capable of transmitting data independently of the other fibers. Relative to metal wire interconnects, optical fibers have a much greater bandwidth, they are less susceptible to interference, and they are much thinner and lighter. Because of these advantageous physical and data transmission properties, efforts have been made to integrate fiber optics into computer system designs. For example, in a local area network, fiber optics may be used to connect a plurality of local computers to centralized equipment, such as servers and printers. In this arrangement, each local computer has an optical transceiver for transmitting and receiving optical information. The optical transceiver may be mounted on a printed circuit board that supports one or more integrated circuits. Typically, each computer includes several printed circuit boards that are plugged into the sockets of a common backplane. The backplane may be active (i.e., it includes logic circuitry for performing computing functions) or it may be passive (i.e., it does not contain any logic circuitry). An external network fiber optic cable may be connected to the optical transceiver through a fiber optic connector that is coupled to the backplane.

Vetical cavity surface emitting lasers (VCSELs) are becoming an important element of fiber optic links in modern data communication. For example, VCSELs have replaced light-emitting diodes (LEDs) in all local area network (LAN) applications for data rates of 1 Gigabits-per-second (Gb/s) or higher. The rapid increase in Internet traffic is creating communications bottlenecks in the back plane of computers and in the switches and routers that direct the data flow throughout computer networks. Since these applications cover a relatively short distance (e.g., about 1–100 meters), it is more economical to use parallel links over multiple fibers rather than higher speed serial links over a single fiber. Of particular interest is an application with twelve channels operating at 2.5 Gb/s. For short distance applications in which the cost of twelve-fiber ribbon interconnects is relatively low, this parallel solution is less expensive than a serial channel operating at the combined data rate of 30 Gb/s. Ribbon interconnects with four fibers, eight fibers and sixteen fibers operating at data rates of 1–10 Gb/s per channel and with aggregate throughputs in excess of 100 Gb/s are expected to be developed within the next two years.

By design, a VCSEL emits laser light from the top surface of a light-emitting cavity with a relatively small beam divergence (e.g., on the order of 10°). These features allow VCSELs to be arranged in one-dimensional or two-dimensional arrays, tested in parallel, and easily incorporated into an optical transceiver module and coupled to a fiber optic ribbon interconnect. Efforts have been made to simplify the problem of aligning the optical ports of an optical transceiver module with the fibers of a fiber optic ribbon interconnect. In one single-fiber alignment approach, the optoelectronic device is die and wire bonded to a transceiver package so that it may be biased to its normal operating condition. The input end of the fiber is mechanically manipulated in front of the active region of the optoelectronic device until an optical coupling between the fiber and the optoelectronic device is achieved. After the optimal coupling has been achieved, the optoelectronic device is bonded in place. This process requires either human interaction or expensive equipment that automatically dithers the fiber into the optimal position. This conventional alignment process becomes significantly more complicated when applied to the coupling of arrays of optical fibers with arrays of optoelectronic devices. Additional difficulties arise when an optical lens system must be aligned between the optoelectronic devices and the optical fibers.

SUMMARY

The invention features a scheme (systems and methods) for passively aligning one or more optical devices with a corresponding number of optical lenses in an accurate and efficient manner. By this approach, the invention avoids the often labor-intensive and costly steps required by conventional active alignment techniques that attempt to align the optical devices to the optical fibers.

In one aspect, the invention features an optoelectronic device, comprising an optical device system, an optical lens system and a plurality of solder bumps disposed therebetween. The optical device system includes an optical device substrate supporting one or more optical devices and a solderable metallization pattern having a spatial arrangement with respect to the one or more optical devices. The optical lens system includes one or more optical lenses and a device bonding surface supporting a solderable metallization pattern having a spatial arrangement with respect to the one or more optical lenses. The solder bumps are disposed between the metallization patterns of the optical device system and the optical lens system. The plurality of solder bumps bond the optical device substrate to the device bonding surface with the one or more optical devices aligned with the one or more optical lenses.

Embodiments in accordance with this aspect of the invention may include one or more of the following features.

The one or more optical lenses may be incorporated into the device bonding surface. Alternatively, the one or more optical lenses may be recessed below the device bonding surface.

In some embodiments, the optical lens system includes an optical substrate incorporating the one or more lenses and the device bonding surface defines one face of a spacer substrate. The optical substrate may be bonded to the spacer substrate by a wafer bonding process or a flip-chip solder bonding process. The thickness of the device bonding substrate preferably is selected based upon a representative focal distance between the one or more optical devices and the one or more optical lenses. The spacer substrate may be transparent or it may comprise one or more apertures through which light is transmitted between the one or more optical devices and the one or more optical lenses. An integrated circuit may be formed on the spacer substrate and may be configured to drive the one or more optical devices. Alternatively, the integrated circuit may be bonded to the spacer substrate by a flip-chip solder bonding process.

In some embodiments, a characteristic dimension of the plurality of solder bumps may be selected based upon a representative focal distance between the one or more optical devices and the one or more optical lenses.

The one or more optical devices may include a vertical cavity surface emitting laser or a detector, or both.

In another aspect, the invention features an optoelectronic device comprising an optical lens system and an optical device system. The optical lens system includes a lens substrate supporting one or more optical lenses, and a spacer substrate defining one or more apertures therethrough. The optical device system includes a device substrate supporting one or more optical devices. The lens substrate is bonded to the spacer substrate and the spacer substrate is bonded to the device substrate with the one or more optical lenses, the one or more optical apertures and the one or more optical devices held together in registered alignment.

In another aspect, the invention features a method of aligning an optical device system and an optical lens system. In accordance with this inventive method, an optical device system having one or more of optical devices and a solderable metallization pattern is positioned adjacent to an optical lens system having one or more of optical lenses and a solderable metallization pattern with a plurality of solder bumps disposed thereon. The plurality of solder bumps are heated to a temperature at or above the melting point of the solder bumps. Upon cooling, the plurality of solder bumps bond the optical device system to the optical lens system with the one or more optical devices aligned with the one or more optical lenses.

Among the advantages of the invention are the following.

By enabling the optical device system to be passively aligned with the optical lens system, the invention reduces manufacturing costs and manufacturing time. The invention also reduces the sensitivity of the optical device performance to the thickness of the optical device substrate by bonding the device side of the optical device substrate to the device bonding surface of the optical lens system. In addition, the invention enables electrical connections to be made through the solder bump bonds and, thereby, avoids the need for wirebond electrical connections. This feature reduces inductance and electromagnetic interference (EMI) emissions commonly associated with such wirebond connections.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments or relative dimensions of the depicted elements, and are not drawn to scale.

Figure 1:
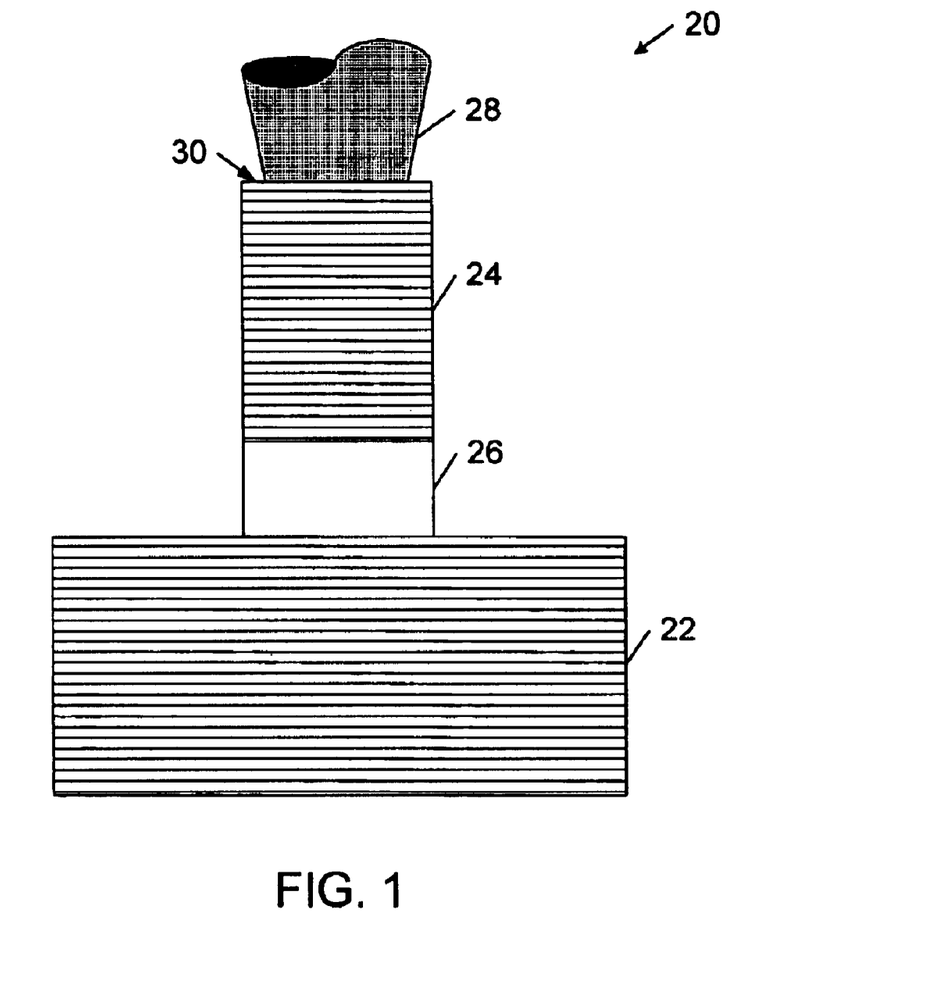
FIG. 1 is a diagrammatic side view of a vertical cavity surface emitting laser.

Referring to FIG. 1, each of the following embodiments may include one or more optical devices, including a vertical cavity surface emitting laser (VCSEL) 20 and a semiconductor diode. VCSEL 20 may be formed on a semiconductor substrate from alternating layers of semiconductor material. Each VCSEL includes a bottom mirror 22, a top mirror 24 and a gain region 26. Each VCSEL also may include one or more bonding pads (not shown) to which an electrical driving circuit of an adapter card may connect. In response to the application of an electrical current through the one or more bonding pads, VCSEL 20 may produce a laser beam 28 with a substantially circular cross-section and a well-controlled wavelength that is defined by the vertical distance separating bottom mirror 22 and top mirror 24. The surface dimension of the optical interface 30 of the VCSEL laser cavity typically is on the order of 10 $\mu$m.

As explained in detail below, the optical devices (e.g., VCSELs) of an optoelectronic device 10 may be passively aligned with an optical lens system by bonding metallization patterns of the optical device system and the optical lens system using solder bump reflow technology. This feature reduces manufacturing costs and manufacturing time. The sensitivity of optical device performance to the thickness of the optical device substrate also may be reduced by bonding the device side of the optical device substrate to the device bonding surface of the optical lens system. In addition, electrical connections may be made through the solder bump bonds, thereby avoiding the need for wirebond electrical connections. This feature reduces inductance and electromagnetic interference (EMI) emissions commonly associated with such wirebond connections.

Figure 2:
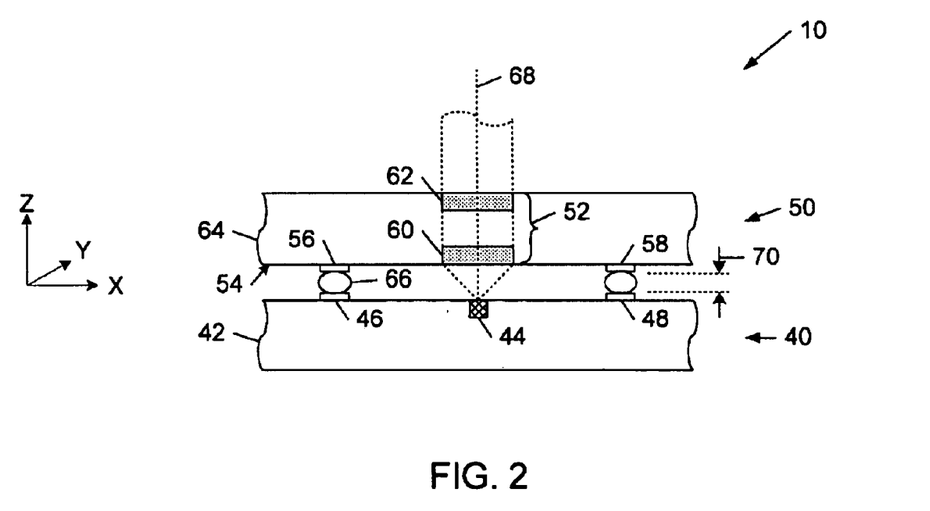
FIG. 2 is a diagrammatic side view of an optical device system aligned and bonded to an optical lenses system.

Referring to FIG. 2, in one embodiment, optoelectronic device 10 includes an optical device system 40 having an optical device substrate 42 supporting an optical device 44 (e.g., a light detector, such as a p-i-n diode, or a light-emitter, such as a VCSEL) and a solderable metallization pattern 46, 48 having a spatial arrangement with respect to optical device 44. Optoelectronic device 10 also includes an optical lens system 50 having an optical element 52 and a device bonding surface 54 supporting a solderable metallization pattern 56, 58 with a spatial arrangement with respect to optical element 52. The metallization patterns 46, 48 and 56, 58 may match identically or they may be different, in either case, however, the metallization patterns 46, 48 and 56, 58 are arranged so that when they are solder bonded together optical device 44 and optical element 52 are aligned. Optical element 52 may include a device-side optical lens 60 and a fiber-side optical lens 62. Optical lenses 60, 62 may be diffractive or refractive optical lenses formed on an optical substrate 64 (e.g., a glass substrate). Optoelectronic device 10 further includes a plurality of solder bumps 66 disposed between the metallization patterns 46, 48 and 56, 58. During manufacture, solder bumps 66 originally are disposed on metallization pattern 56, 58 of optical lens system 50. Optical device substrate 42 is aligned with optical substrate 64 to within an accuracy required for solder bumps 66 to contact the metallization pattern 46, 48 of optical device system 40. The assembly then is raised to a temperature at or above the melting point of solder bumps 66. Solder bumps 66 wet the solderable metallization pattern 46, 48 and surface tension forces pull optical substrate 64 and optical device substrate 42 in very precise alignment (e.g., to within ±4 µm). The assembly is cooled to form a solidly bonded, accurately aligned structure. This bonded structure may be incorporated into a header block of a transceiver module and aligned with the optical fibers of a fiber optic ribbon interconnect using conventional ferrule-based alignment technology.

In the resulting structure of optoelectronic device 10, solder bump reflow between metallization patterns 46, 48 and 56, 58 accurately aligns optical lenses 60, 62 with optical device 44 in the X-Y plane (i.e., orthogonal to a Z-axis 68, which corresponds to the axis of light transmission between optical device system 40 and optical lens system 50). In addition, optical lenses 60, 62 and optical device 44 are aligned along Z-axis 68 to achieve a desired focal distance between optical device 44 and optical element 52. In the embodiment of FIG. 2, the Z-axis alignment is achieved by adjusting the dimension 70 of solder bumps 66 along Z-axis 68. Dimension 70 may be controlled by balancing surface tension and gravitational forces at the bonding temperature based upon a number of parameters, including individual solder bump volumes, wettable pad sizes, substrate mass and solder surface tension.

Figure 3:
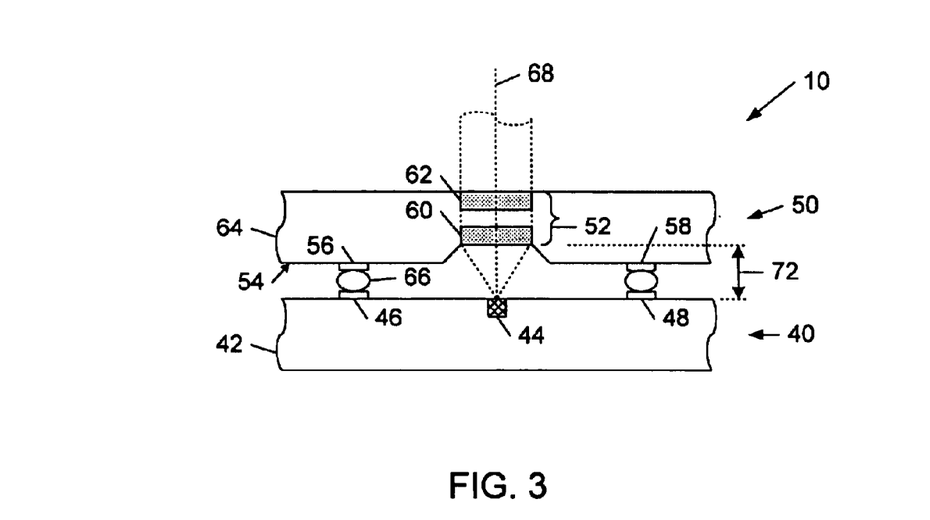
FIG. 3 is a diagrammatic side view of an optical device system aligned and bonded to an optical lens system having an optical element recessed below a device bonding surface.

As shown in FIG. 3, in another embodiment, Z-axis alignment between optical device 44 and optical element 52 may be achieved by recessing optical element 52 below device bonding surface 54 to separate optical device 44 from optical element 52 by a distance 72 needed to achieve a desired focal distance between optical device 44 and optical element 52. Optical element 52 may be recessed below device bonding surface using conventional lithography and etching techniques.

Figure 4A:
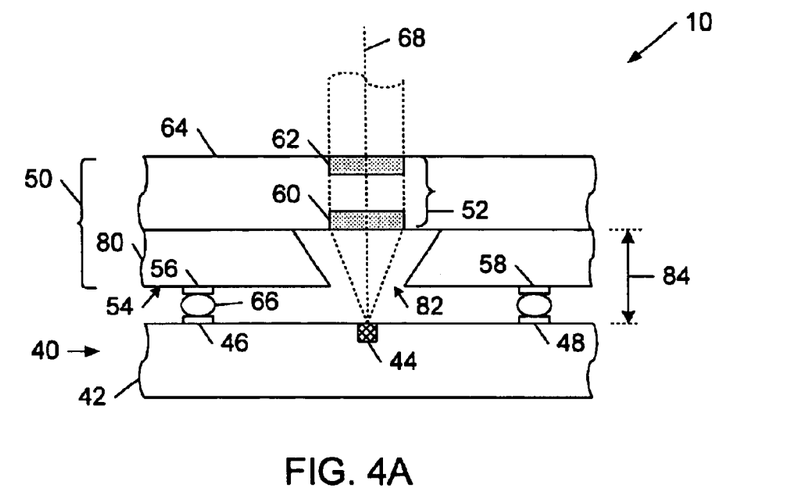
FIG. 4A is a diagrammatic side view of an optical device system aligned and bonded to an optical lenses system formed from a spacer substrate that is bonded to an optical substrate by a wafer bonding process.

Referring to FIG. 4A, in another optoelectronic device embodiment, Z-axis alignment between optical device 44 and optical element 52 is achieved by disposing between optical substrate 64 and optical device substrate 42 a spacer substrate 80 that includes an aperture 82, which enables light to pass between optical device 44 and optical element 52. In this embodiment, device bonding surface 54—which supports metallization pattern 56, 58—defines one face of spacer substrate 80. The Z-axis thickness of spacer substrate 80 is selected to separate optical device 44 from optical element 52 by a distance 84 needed to achieve a desired focal distance between optical device 44 and optical element 52. Spacer substrate 80 may be formed from a semiconductor material, such as silicon, and aperture 82 may be formed using conventional lithography and etching techniques. Spacer substrate 80 may be bonded to optical substrate 64 by conventional wafer bonding processes (e.g., adhesive bonding, silicon fusion bonding, anodic bonding and thermo-compressive bonding processes). Wafer bonding processes advantageously enable optoelectronic devices 10 to be manufactured using batch processing techniques.

Figure 4B:
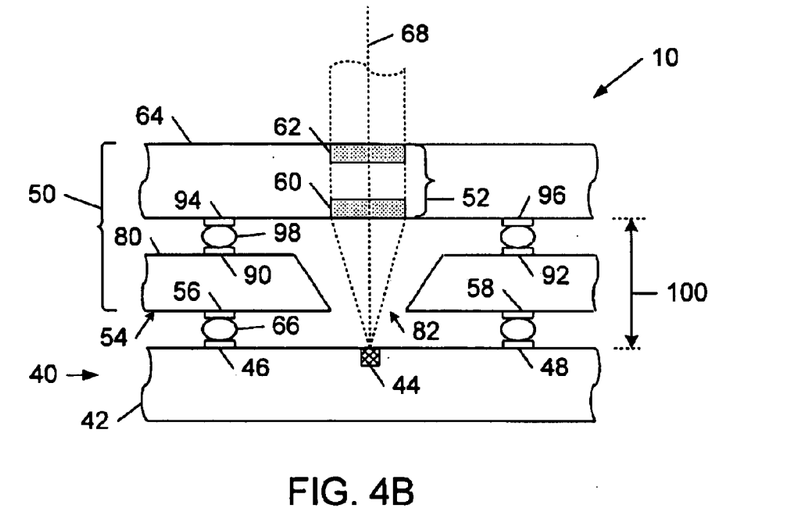
FIG. 4B is a diagrammatic side view of an optical device system aligned and bonded to an optical lenses system formed from a spacer substrate that is bonded to an optical substrate by a solder bump reflow process.

Referring to FIG. 4B, in an alternative optoelectronic device embodiment, spacer substrate 80 and optical substrate 64 may be bonded together using a flip-chip solder bonding process. In this embodiment, spacer substrate 80 includes a fiber-side metallization pattern 90, 92 and optical substrate 64 includes a metallization pattern 94, 96. A plurality of solder bumps 98 are disposed between metallization patterns 90, 92 and 94, 96 to bond optical element 52 in alignment with aperture 82. The Z-axis thickness of spacer substrate 80 and the Z-axis dimension of solder bumps 98 are selected to separate optical device 44 from optical element 52 by a distance 100 needed to achieve a desired focal distance between optical device 44 and optical element 52. During manufacture, solder bumps 98 originally are disposed on metallization pattern 94, 96 of optical substrate 64. Optical substrate 64 is aligned with spacer substrate 80 to within an accuracy required for solder bumps 98 to contact the metallization pattern 90, 92 of spacer substrate 80. The assembly then is raised to a temperature at or above the melting point of solder bumps 98. Solder bumps 98 wet the solderable metallization pattern 90, 92 and surface tension forces pull optical substrate 64 and spacer substrate 80 into very precise alignment (e.g., to within ±4 µm). The assembly is cooled to form a solidly bonded, accurately aligned structure.

Figure 5A:
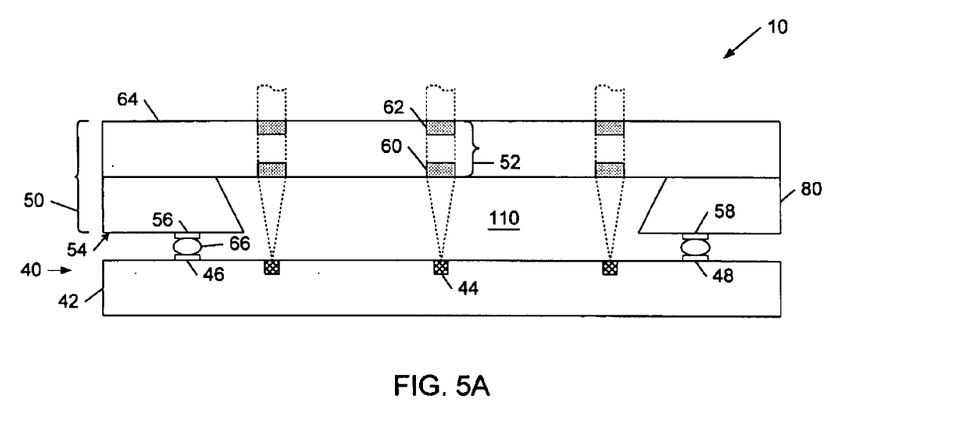
FIG. 5A is a diagrammatic side view of an optical device system including an array of optical devices aligned and bonded to an optical lens system formed from an optical substrate and a spacer substrate having a single aperture.
Figure 5B:
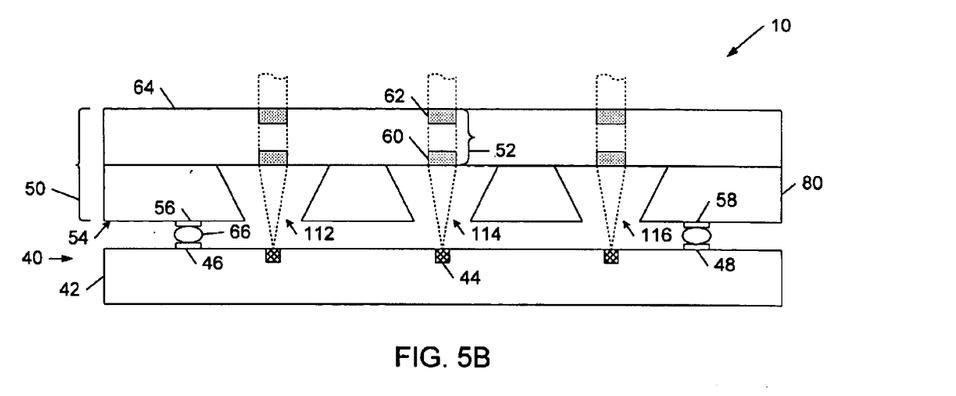
FIG. 5B is a diagrammatic side view of an optical device system including an array of optical devices aligned and bonded to an optical lens system formed from an optical substrate and a spacer substrate having a plurality of apertures.

Referring to FIGS. 5A and 5B, optoelectronic device 10 may include one or more optical devices 44 and a corresponding number of optical elements 52. As shown in FIG. 5A, spacer substrate 80 may include a single aperture 110 through which light is transmitted between the pairs of optical devices 44 and optical elements 52. Alternatively, as shown in FIG. 5B, spacer substrate 80 may include an aperture 112, 114, 116 for each pair of optical devices 44 and optical elements 52.

Figure 6A:
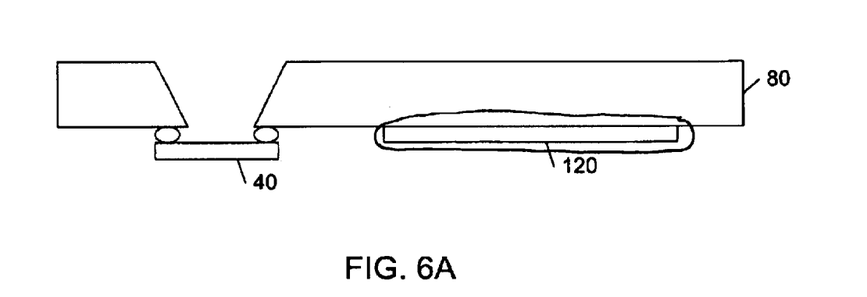
FIG. 6A is a diagrammatic side view of an optical device system bonded to a spacer substrate with an integral integrated circuit.
Figure 6B:
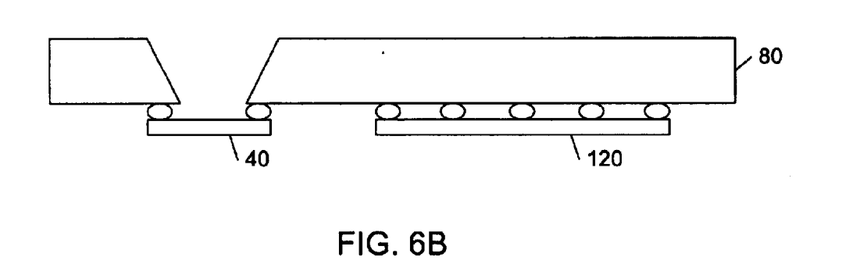
FIG. 6B is a diagrammatic side view of an optical device system bonded to a spacer substrate to which an integrated circuit is bonded by a flip-chip solder bonding process.

As shown in FIGS. 6A and 6B, in some embodiments, an integrated circuit 120, which is configured to drive the optical devices of optical device system 40, may be formed integrally with spacer substrate 80 by conventional semiconductor processing techniques (FIG. 6A). Alternatively, integrated circuit 120 may be bonded to spacer substrate 80 by a conventional flip-chip solder bonding process (FIG. 6B).

Figure 7A:
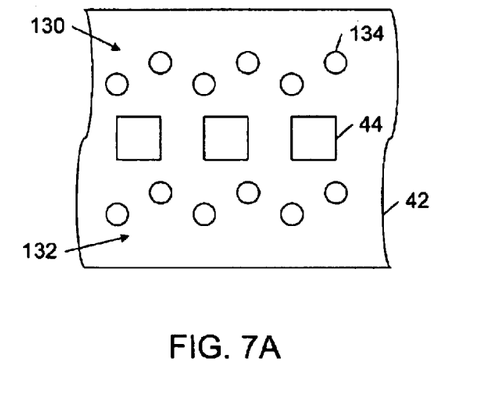
FIG. 7A is a diagrammatic top view of an optical device array and a pair of staggered arrays of solderable bonding pads running along opposite sides of the optical device array.
Figure 7B:
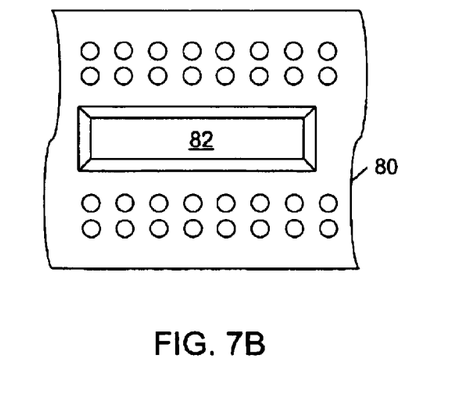
FIG. 7B is a diagrammatic top view of a spacer substrate supporting a regular rectangular array of solderable bonding pads on opposite sides of an aperture.

In each of the above-described embodiments, the metallization patterns may be arranged in a variety of ways to achieve a range of alignment accuracies. For example, in one embodiment, the metallization pattern of optical device system 40 (and consequently the metallization pattern of device bonding surface 54) may consist of two staggered arrays 130, 132 of solderable bonding pads 134 running along opposite sides of a linear array of optical devices 44, as shown in FIG. 7A. In another embodiment, the metallization patterns of optical substrate 64 and spacer substrate 80 may consist of a regular rectangular array of spaced apart solderable bonding pads disposed on opposite sides of aperture 82, as shown in FIG. 7B.

Other embodiments are within the scope of the claims. For example, in optoelectronic device embodiments accommodating more than two optical channels in parallel, optical devices 44 and optical elements 52 may be arranged in one-dimensional or two-dimensional arrays.

What is claimed is:

1. An optoelectronic device, comprising:

an optical device system comprising an optical device substrate supporting one or more optical devices and a solderable metallization pattern having a spatial arrangement with respect to the one or more optical devices;

an optical lens system comprising one or more optical lenses and a device bonding surface supporting a solderable metallization pattern having a spatial arrangement with respect to the one or more optical lenses, wherein the one or more optical lenses are recessed below the device bonding surface; and a plurality of solder bumps disposed between the metallization patterns of the optical device system and the optical lens system;

wherein the plurality of solder bumps bond the optical device substrate to the device bonding surface with the one or more optical devices aligned with the one or more optical lenses.

2. The optoelectronic device of claim 1, wherein each solder bump is in direct contact with respective metallization patterns of the optical device system and the optical lens system.

3. An optoelectronic device, comprising:

an optical device system comprising an optical device substrate supporting one or more optical devices and a solderable metallization pattern having a spatial arrangement with respect to the one or more optical devices;

an optical lens system comprising one or more optical lenses incorporated into an optical substrate bonded to a spacer substrate having a device bonding surface supporting a solderable metallization pattern having a spatial arrangement with respect to the one or more optical lenses; and a plurality of solder bumps disposed between the metallization patterns of the optical device system and the optical lens system;

wherein the plurality of solder bumps bond the optical device substrate to the device bonding surface with the one or more optical devices aligned with the one or more optical lenses.

4. The optoelectronic device of claim 3, wherein a wafer bond bonds the optical substrate to the spacer substrate.

5. The optoelectronic device of claim 3, wherein a solder bond bonds the optical substrate to the spacer substrate.

6. The optoelectronic device of claim 3, wherein the thickness of the spacer substrate is selected based upon a representative focal distance between the one or more optical devices and the one or more optical lenses.

7. The optoelectronic device of claim 3, wherein the spacer substrate comprises one or more apertures through which light is transmitted between the one or more optical devices and the one or more optical lenses.

8. The optoelectronic device of claim 7, wherein multiple optical devices are arranged for optical communication through multiple respective spacer substrate apertures.

9. The optoelectronic device of claim 7, wherein each of the spacer substrate apertures has a lens substrate opening at a surface facing the lens substrate and a device substrate opening at a surface facing the device substrate, wherein for each spacer substrate aperture the lens substrate opening is larger than the device substrate opening.

10. The optoelectronic device of claim 3, further comprising an integrated circuit formed on the spacer substrate and configured to drive the one or more optical devices.

11. The optoelectronic device of claim 3, further comprising an integrated circuit bonded to the spacer substrate by a flip-chip solder bond and configured to drive the one or more optical devices.

12. The optoelectronic device of claim 3, wherein the one or more optical devices comprises a vertical cavity surface emitting laser or a detector, or both.

13. The optoelectronic device of claim 3, wherein the one or more optical lenses are incorporated into a surface of the optical substrate.

14. The optoelectronic device of claim 3, wherein the one or more optical lenses are recessed below the device bonding surface.

15. The optoelectronic device of claim 3, wherein multiple optical lenses are cooperatively arranged in optical alignment with multiple respective optical devices.

16. The optoelectronic device of claim 3, wherein a wafer bond bonds the optical substrate to the spacer substrate.

17. The optoelectronic device of claim 3, wherein a solder bond bonds the optical substrate to the spacer substrate.

18. An optoelectronic device, comprising:

an optical device system comprising an optical device substrate supporting one or more optical devices and a solderable metallization pattern having a spatial arrangement with respect to the one or more optical devices;

an optical lens system comprising one or more optical lenses and a device bonding surface supporting a solderable metallization pattern having a spatial arrangement with respect to the one or more optical lenses; and a plurality of solder bumps disposed between the metallization patterns of the optical device system and the optical lens system, wherein the plurality of solder bumps bond the optical device substrate to the device bonding surface with the one or more optical devices aligned with the one or more optical lenses, and, wherein a characteristic dimension of the plurality of solder bumps is selected based upon a representative focal distance between the one or more optical devices and the one or more optical lenses.

19. The optoelectronic device of claim 18, wherein each solder bump is in direct contact with respective metallization patterns of the optical device system and the optical lens system.

20. An optoelectronic device, comprising:

an optical lens system comprising a lens substrate supporting one or more optical lenses, and a semiconductor spacer substrate defining one or more apertures therethrough; and an optical device system comprising a device substrate supporting one or more optical devices;

wherein each of the spacer substrate apertures has a lens substrate opening at a surface facing the lens substrate and a device substrate opening at a surface facing the device substrate, wherein for each spacer substrate aperture the lens substrate opening is larger than the device substrate opening, and wherein the lens substrate is bonded to the spacer substrate and the spacer substrate is bonded to the device substrate with the one or more optical lenses, the one or more optical apertures and the one or more optical devices held together in registered alignment.

21. An optoelectronic device, comprising:

an optical lens system comprising a lens substrate supporting one or more optical lenses, and a semiconductor spacer substrate defining one or more apertures therethrough, wherein multiple optical devices are arranged for optical communication through multiple respective spacer substrate apertures; and an optical device system comprising a device substrate supporting one or more optical devices;

wherein the lens substrate is bonded to the spacer substrate and the spacer substrate is bonded to the device substrate with the one or more optical lenses, the one or more optical apertures and the one or more optical devices held together in registered alignment.

* * * * *